(12) United States Patent
Chi (10) Patent No.: US 11,145,524 B2
(45) Date of Patent: Oct. 12, 2021

(54) APPARATUS AND METHOD FOR TREATING SUBSTRATE

(71) Applicant: SEMES CO., LTD., Chungcheongnam-do (KR)

(72) Inventor: Sukhwan Chi, Gyeonggi-do (KR)

(73) Assignee: SEMES CO., LTD, Chungcheongnam-Do (KR)

( * ) Notice: Subject to any disclaimer, the term of this patent is extended or adjusted under 35 U.S.C. 154(b) by 0 days.

(21) Appl. No.: 16/936,041

(22) Filed: Jul. 22, 2020

(65) Prior Publication Data
US 2021/0028028 A1    Jan. 28, 2021

(30) Foreign Application Priority Data
Jul. 22, 2019    (KR) .................. 10-2019-0088349

(51) Int. Cl.
*G03F 7/38* (2006.01)
*H01L 21/67* (2006.01)

(52) U.S. Cl.
CPC .......... *H01L 21/67103* (2013.01); *G03F 7/38* (2013.01); *H01L 21/67017* (2013.01)

(58) Field of Classification Search
CPC ......... H01L 21/67103; H01L 21/67017; H01L 21/67098; H01L 21/205; H01L 21/67109; H01L 21/68742; H01L 21/6719; H01L 21/02274; H01L 21/67196; H01L 21/324; H01L 21/02; H01L 21/67011; H01L 21/02312; H01L 21/02271; H01L 21/02046; H01L 21/6875; H01L 21/67178; H01L 21/02337; G03F 7/38; G03F 7/16; C23C 16/45565; C23C 16/52; C23C 16/45563; C23C 16/46; C23C 16/4405; C23C 16/4412; C23C 16/455; H01J 37/32449; H01J 37/3244; H01J 37/32633; H01J 37/32834
See application file for complete search history.

(56) References Cited

U.S. PATENT DOCUMENTS

2012/0000886 A1* 1/2012 Honda .............. H01J 37/32633
216/24

FOREIGN PATENT DOCUMENTS

| JP | 2003-257836 A | 9/2003 |
| KR | 1020020081118 A | 10/2002 |

(Continued)

OTHER PUBLICATIONS

Office Action for related KR Application No. 10-2019-0088349 dated Nov. 19, 2020, 4 pages.

*Primary Examiner* — Mesfin T Asfaw
(74) *Attorney, Agent, or Firm* — Procopio, Cory, Hargreaves & Savitch LLP (57) ABSTRACT

An apparatus for treating a substrate using a process gas includes a chamber having a treatment space defined therein, a substrate support unit for supporting the substrate in the treatment space, a gas supply pipe disposed in a ceiling surface of the chamber for supplying the process gas to the treatment space, and an exhaust unit for exhausting the process gas in the treatment space, wherein the exhaust unit includes an exhaust plate having an exhaust hole defined therein through which the process gas is exhausted, and an adjustment plate overlapping the exhaust plate, wherein the adjustment plate is constructed to control an opened amount of the exhaust hole when viewed from above.

11 Claims, 8 Drawing Sheets

(56) References Cited

FOREIGN PATENT DOCUMENTS

| KR | 10-2005-0029802 A | 3/2005 |
| KR | 10-2009-0005697 A | 1/2009 |
| KR | 10-2009-0024520 A | 3/2009 |
| KR | 1020180000928 A | 1/2018 |
| KR | 1020190004255 A | 1/2019 |

\* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0088349 filed on Jul. 22, 2019, in the Korean Intellectual Property Office, the entire contents of which are hereby incorporated by reference.

BACKGROUND

Embodiments of the inventive concept described herein relates to an apparatus and a method for treating a substrate using a process gas.

In order to manufacture a semiconductor device, various processes such as cleaning, deposition, photolithography, etching, and ion implantation are performed. Among these processes, certain processes are performed in a chamber having a treatment space defined therein.

Among these processes, the photolithography process includes an application process to form a coating film on a substrate. Before forming the coating film, an operation of modifying a surface of the substrate must be performed.

In general, the surface modification operation of the substrate includes an operation of converting a hydrophilic surface to a hydrophobic surface. The surface modification operation is done by supplying a process gas to the surface of the substrate. The process gas is supplied to a treatment space in which the substrate is placed. In this connection, a surface state is changed based on a stay time of the process gas and a flow rate of the process gas.

However, in a process of treating a plurality of substrates, a high substrate throughput per hour and a low cost are required. For this reason, it is difficult to change a preset gas supply amount and a preset treating time as used for treating the substrate.

SUMMARY

Embodiments of the inventive concept provide an apparatus and a method that may control a residual amount of gas in a space for treating a substrate.

An embodiment of the inventive concept provides an apparatus and a method for treating a substrate using a process gas.

According to an exemplary embodiment, an apparatus for treating a substrate using a process gas includes a chamber having a treatment space defined therein, a substrate support unit for supporting the substrate in the treatment space, a gas supply pipe disposed in a ceiling surface of the chamber for supplying the process gas to the treatment space, and an exhaust unit for exhausting the process gas in the treatment space, wherein the exhaust unit includes an exhaust plate having an exhaust hole defined therein through which the process gas is exhausted, and an adjustment plate overlapping the exhaust plate, wherein the adjustment plate is constructed to control an opened amount of the exhaust hole when viewed from above.

When viewed from above, the exhaust hole may not overlap the substrate placed on the substrate support unit. The apparatus may further include a counterpart plate facing away the substrate placed on the substrate support unit, wherein the supply pipe is connected to a center of the counterpart plate, and wherein the exhaust plate is constructed to surround the counterpart plate.

The counterpart plate and the exhaust plate may be integrally formed with each other. The adjustment plate may be stacked on the exhaust plate, wherein the adjustment plate has an adjustment hole corresponding to the exhaust hole.

The adjustment plate may be located above the exhaust plate. The supply pipe may be installed in a center of the ceiling surface, wherein the exhaust hole includes a plurality of exhaust holes, wherein the adjustment plate is constructed to vary an overlapping amount between the adjustment hole and the exhaust hole when viewed from above. The plurality of exhaust holes may be spaced apart from each other, wherein the adjustment hole may include a plurality of adjustment holes spaced apart from each other, wherein the plurality of exhaust holes may be arranged such that a series thereof forms a ring shape, wherein the plurality of adjustment holes are arranged such that a series thereof forms a ring shape.

Each of the exhaust hole and the adjustment hole may extend in an arc shape. The adjustment plate may rotate about a central axis thereof to vary the overlapping amount between the adjustment hole and the exhaust hole.

According to an exemplary embodiment, a method for treating a substrate using the apparatus as defined above includes adjusting the opened amount of the exhaust hole to control a surface property value of the substrate.

The surface property value of the substrate may be a contact angle.

When the contact angle is set to a first contact angle, an exhausted amount of the process gas is set to a first exhausted amount, and when the contact angle is set to a second contact angle, an exhausted amount of the process gas is set to a second exhausted amount, the first contact angle may be greater than the second contact angle, and the first exhausted amount may be greater than the second exhausted amount.

A supply amount of the process gas and a treating time duration when the contact angle is set to the first contact angle may be respectively equal to a supply amount of the process gas and a treating time duration when the contact angle is set to the second contact angle.

The process gas may include hexamethyldisilazane (HMDS).

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, an embodiment of the inventive concept will be described in more detail with reference to the accompanying drawings. The embodiments of the inventive concept may be modified in various forms. A scope of the inventive concept should not be construed as being limited to the embodiments below. The embodiments are provided to describe the inventive concept more fully to those with average knowledge in the art. Therefore, a shape of each of elements in the drawings is exaggerated for clearer description.

Figure 1:
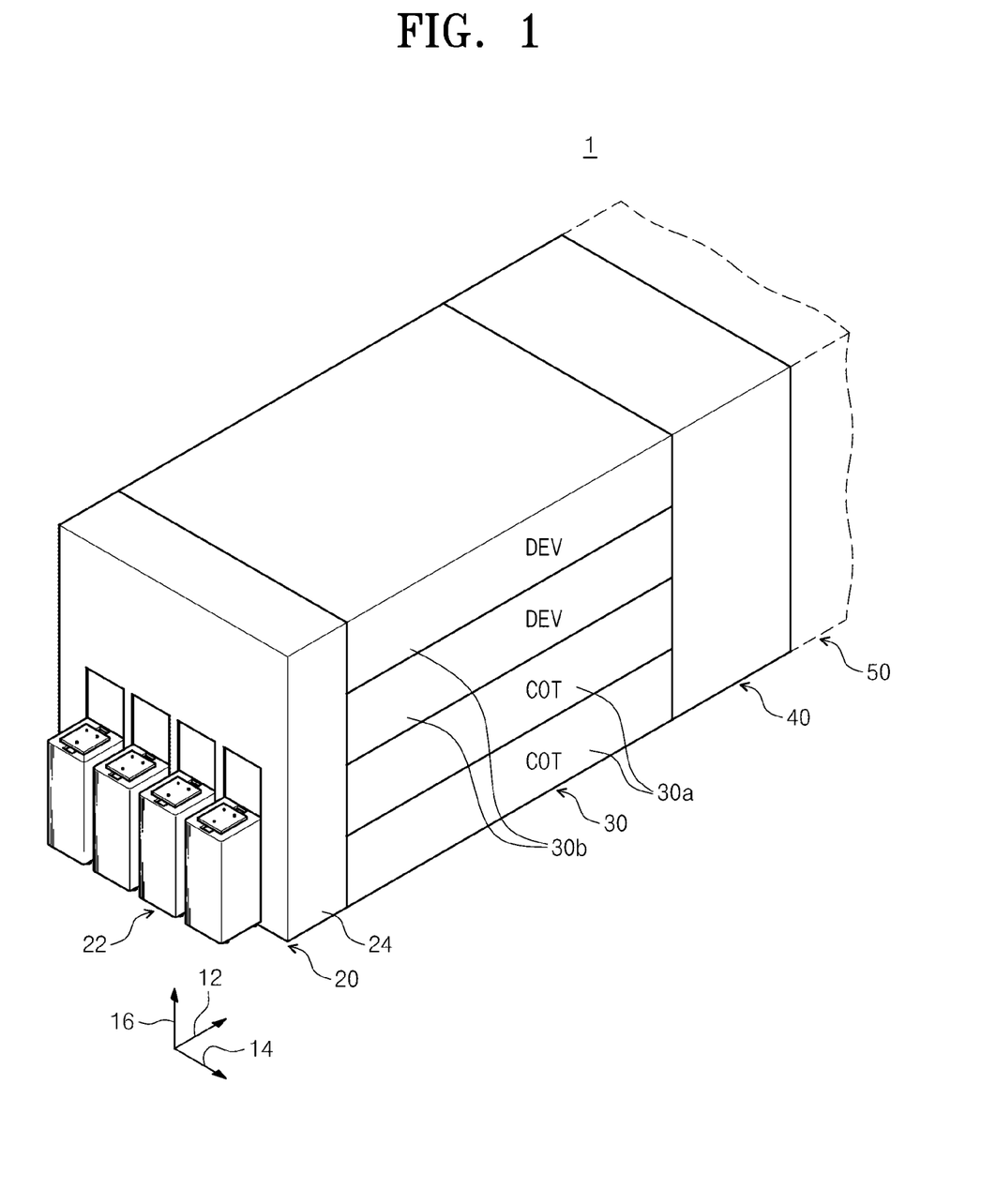
FIG. 1 is a perspective view schematically showing a substrate treating apparatus according to an embodiment of the inventive concept.
Figure 2:
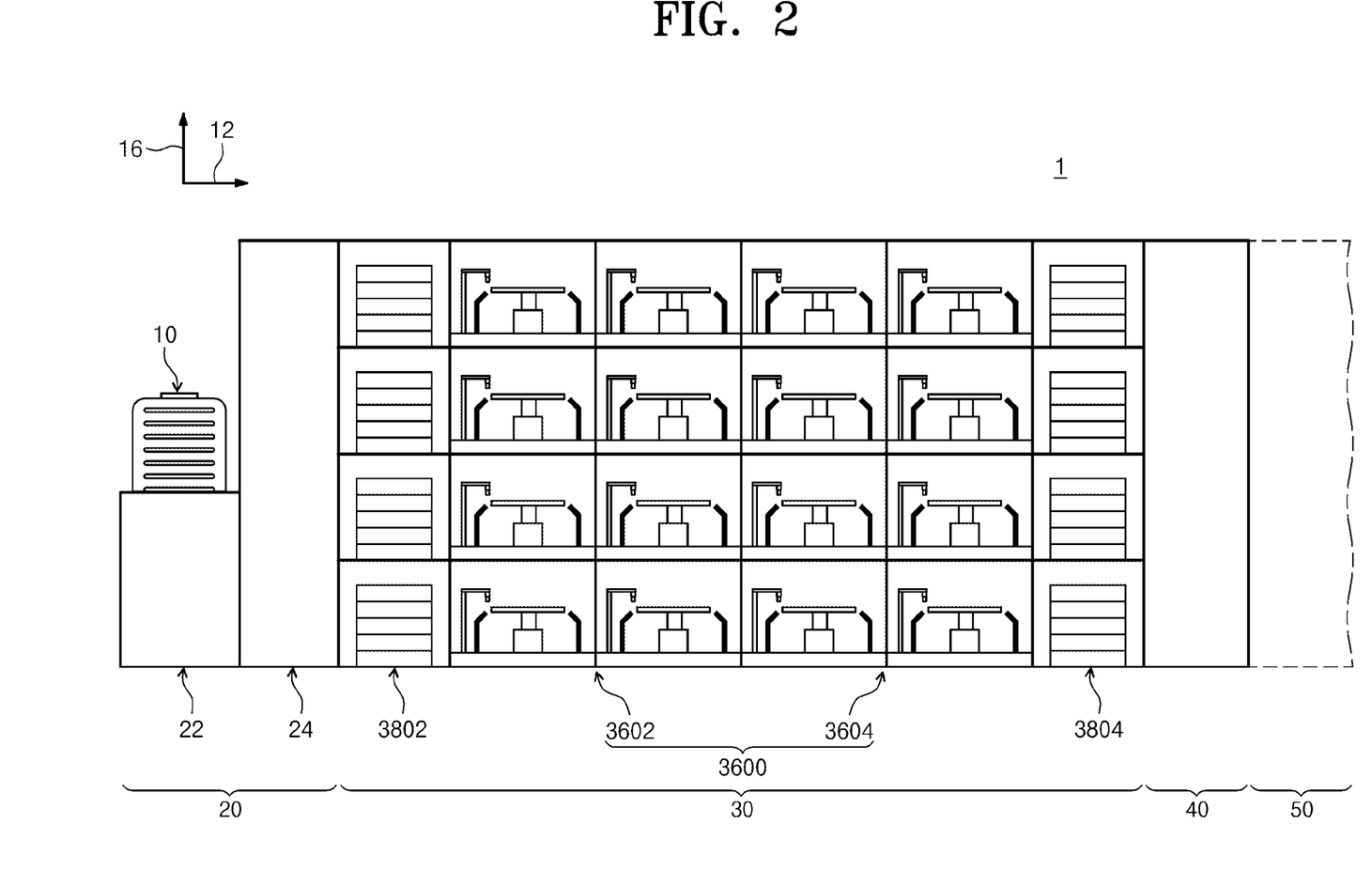
FIG. 2 is a cross-sectional view of a substrate treating apparatus showing an application block or a developing block of FIG. 1.
Figure 3:
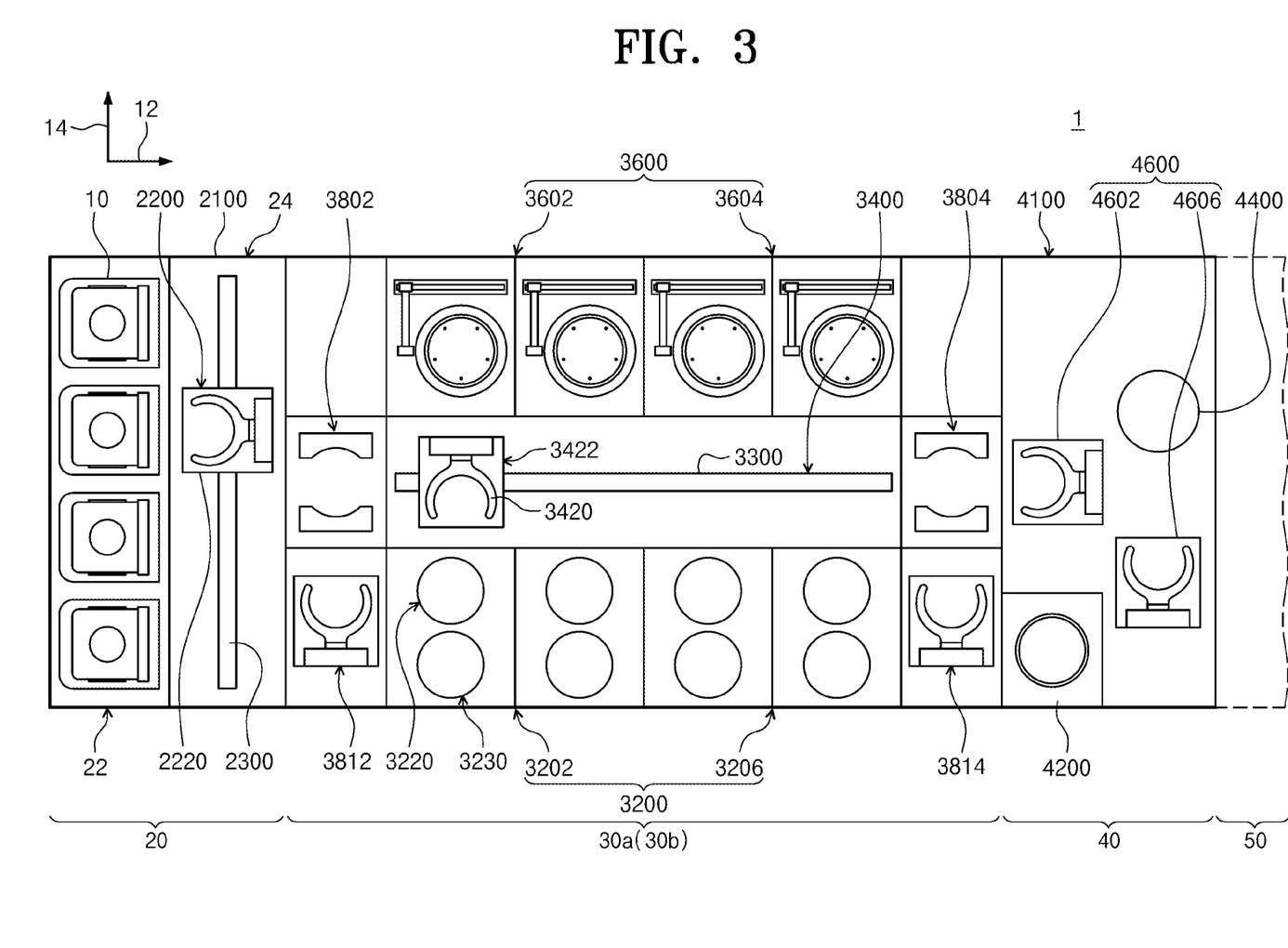
FIG. 3 is a plan view of the substrate treating apparatus of FIG. 2.

FIG. 1 is a perspective view schematically showing a substrate treating apparatus according to an embodiment of the inventive concept. FIG. 2 is a cross-sectional view of the substrate treating apparatus showing an application block or a developing block of FIG. 1. FIG. 3 is a plan view of the substrate treating apparatus of FIG. 2. Referring to FIG. 1 to FIG. 3, a substrate treating apparatus 1 includes an index module 20, a treating module 30, and an interface module 40. In one embodiment, the index module 20, the treating module 30, and the interface module 40 are sequentially arranged in series. Hereinafter, a direction in which the index module 20, the treating module 30, and the interface module 40 are arranged is referred to as a first direction 12. When viewed from above, a direction perpendicular to the first direction 12 is referred to as a second direction 14. A direction perpendicular to both the first direction 12 and the second direction 14 is referred to as a third direction 16.

The index module 20 transfers a substrate W from a container 10 in which the substrate W is stored to the treating module 30, and transfers the substrate W which has been treated to the container 10. A length direction of the index module 20 is the second direction 14. The index module 20 has a load port 22 and an index frame 24. The load port 22 is opposite to the treating module 30 around the index frame 24. The container 10 containing the substrate W therein is placed on the load port 22. A plurality of load ports 22 may be provided. The plurality of load ports 22 may be arranged along the second direction 14.

The container 10 may include the sealing container 10 such as FOUP (Front Open Unified Pod). The container 10 may be placed on the load port 22 by an operator or by transfer means (not shown) such as an overhead transfer, an overhead conveyor, or an automatic guided vehicle.

An index robot 2200 is provided inside the index frame 24. The index frame 24 has a guide rail 2300 having a length direction as the second direction 14. The index robot 2200 may be configured to be movable on the guide rail 2300. The index robot 2200 includes a hand 2220 on which the substrate W is placed. The hand 2220 may be configured to be capable of moving forward and backward, rotating about the third direction 16, and moving along the third direction 16. The treating module 30 performs an application process and a developing process on the substrate W. The treating module 30 has an application block 30a and a developing block 30b. The application block 30a performs the application process on the substrate W. The developing block 30b performs the developing process on the substrate W. A plurality of application blocks 30a may be provided and may be stacked vertically. A plurality of developing blocks 30b may be provided and may be stacked vertically. According to this embodiment, the number of the application blocks 30a is two, and the number of the developing blocks 30b is two. The application blocks 30a may be placed under the developing blocks 30b. In one example, the two application blocks 30a may perform the same process with each other, and may have the same structure as each other. Further, the two developing blocks 30b may perform the same process with each other, and may have the same structure as each other.

The application block 30a has a heat treating chamber 3200, a transfer chamber 3400, a liquid treating chamber 3600, and a buffer chamber 3800. The heat treating chamber 3200 performs a heat treating process on the substrate W. The heat treating process may include a cooling process and a heating process. The liquid treating chamber 3600 supplies liquid on the substrate W and forms a liquid film thereon. The liquid film may be a photoresist film or an anti-reflective film. The transfer chamber 3400 transfers the substrate W between the heat treating chamber 3200 and the liquid treating chamber 3600 within the application block 30a.

The transfer chamber 3400 has a length direction parallel to the first direction 12. A transfer robot 3422 is received in the transfer chamber 3400. The transfer robot 3422 transfers the substrate W between the heat treating chamber 3200, the liquid treating chamber 3600, and the buffer chamber 3800. In one example, the transfer robot 3422 has a hand 3420 on which the substrate W is placed. The hand 3420 may be configured to be capable of moving forward and backward, rotating about the third direction 16, and moving along the third direction 16. The transfer chamber 3400 may have a guide rail 3300 whose a length direction is parallel to the first direction 12. The transfer robot 3422 may be configured to be movable on the guide rail 3300.

Figure 4:
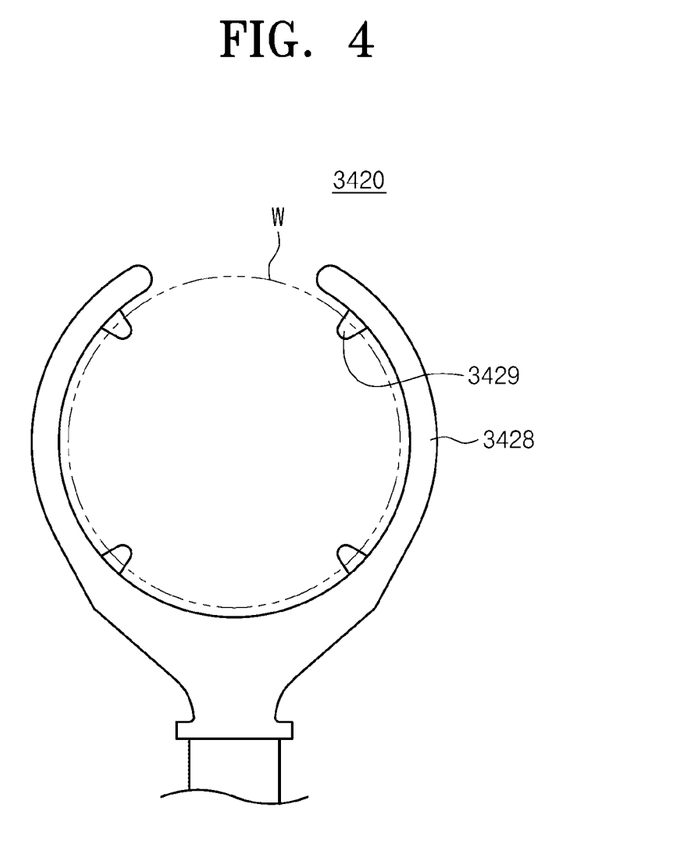
FIG. 4 is a diagram showing an example of a hand of a transfer robot in FIG. 3.

FIG. 4 is a view showing an example of the hand of the transfer robot in FIG. 3. Referring to FIG. 4, the hand 3420 has a base 3428 and support protrusions 3429. The base 3428 may have an annular ring shape whose a portion of a circumference is curved. The base 3428 has an inner diameter larger than a diameter of the substrate W. Each of the support protrusions 3429 extends inwardly from the base 3428. A plurality of support protrusions 3429 may be provided and may support an edge region of the substrate W. In one example, four support protrusions 3429 may be arranged at an equal spacing.

A plurality of heat treating chambers 3200 may be provided and may be arranged along the first direction 12. The heat treating chambers 3202 are located on one side of the transfer chamber 3400. A heat treating chamber 3202 closest to the index module 20 among the heat treating chambers 3200 heats the substrate W before transferring the substrate W to the liquid treating chamber 3600. The remaining heat treating chambers 3206 may heat-treat the substrate which has been treated using liquid in the liquid treating chamber 3600. In this embodiment, the heat treating chamber closest to the index module 20 is defined as the front heat treating chamber 3202.

In this embodiment, the front heat treating chamber 3202 among the plurality of heat treating chambers 3200 will be described by way of example. The front heat treating chamber 3202 may supply a process gas while heating the substrate W, thereby to improve adhesion of photoresist to the substrate W. The process gas modifies the surface of the substrate W. The process gas converts the surface of the substrate W from a hydrophilic state to a hydrophobic state. In one example, the process gas may be hexamethyldisilane gas. Conversely, no process gas is supplied to the rear heat treating chamber 3206.

Figure 5:
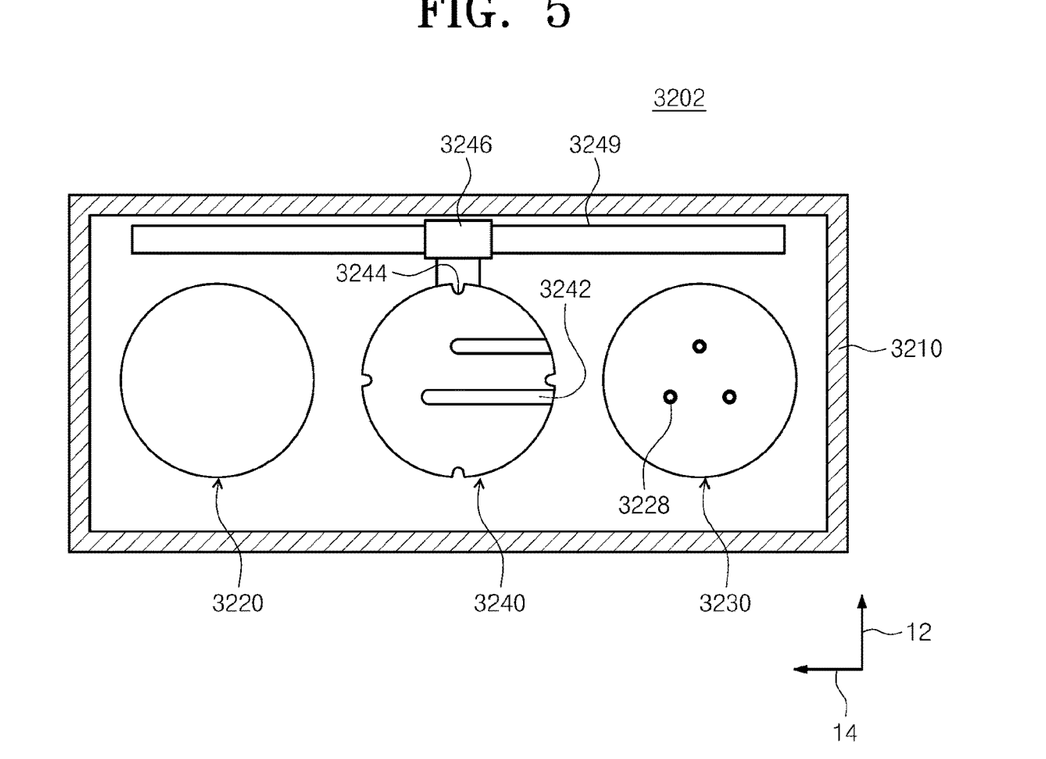
FIG. 5 is a plan view schematically showing an example of a heat treating chamber of FIG. 4.
Figure 6:
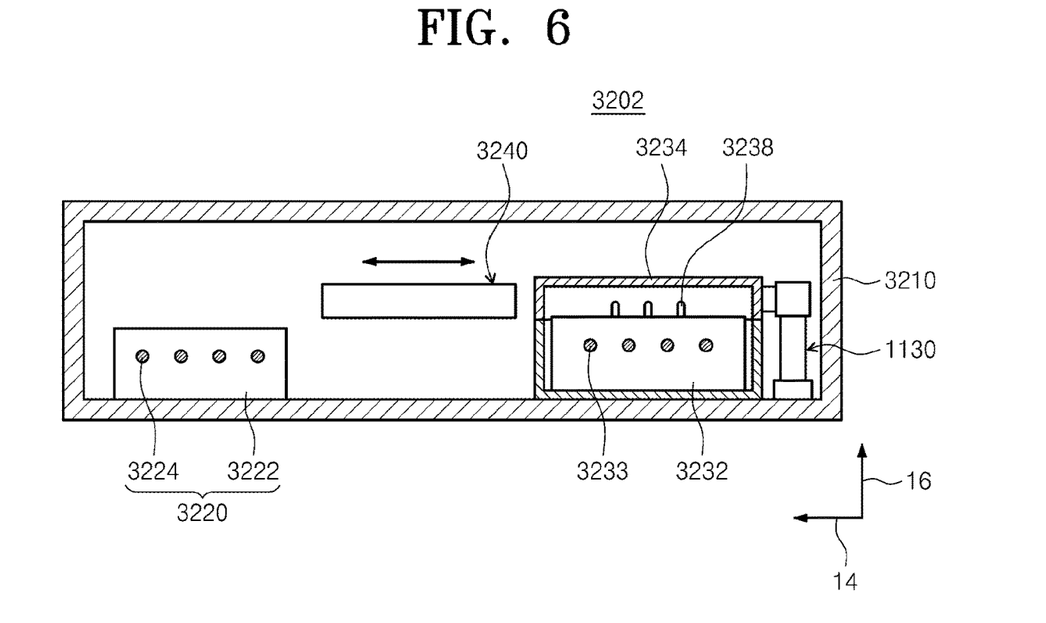
FIG. 6 is a front view of the heat treating chamber of FIG. 5.
Figure 7:
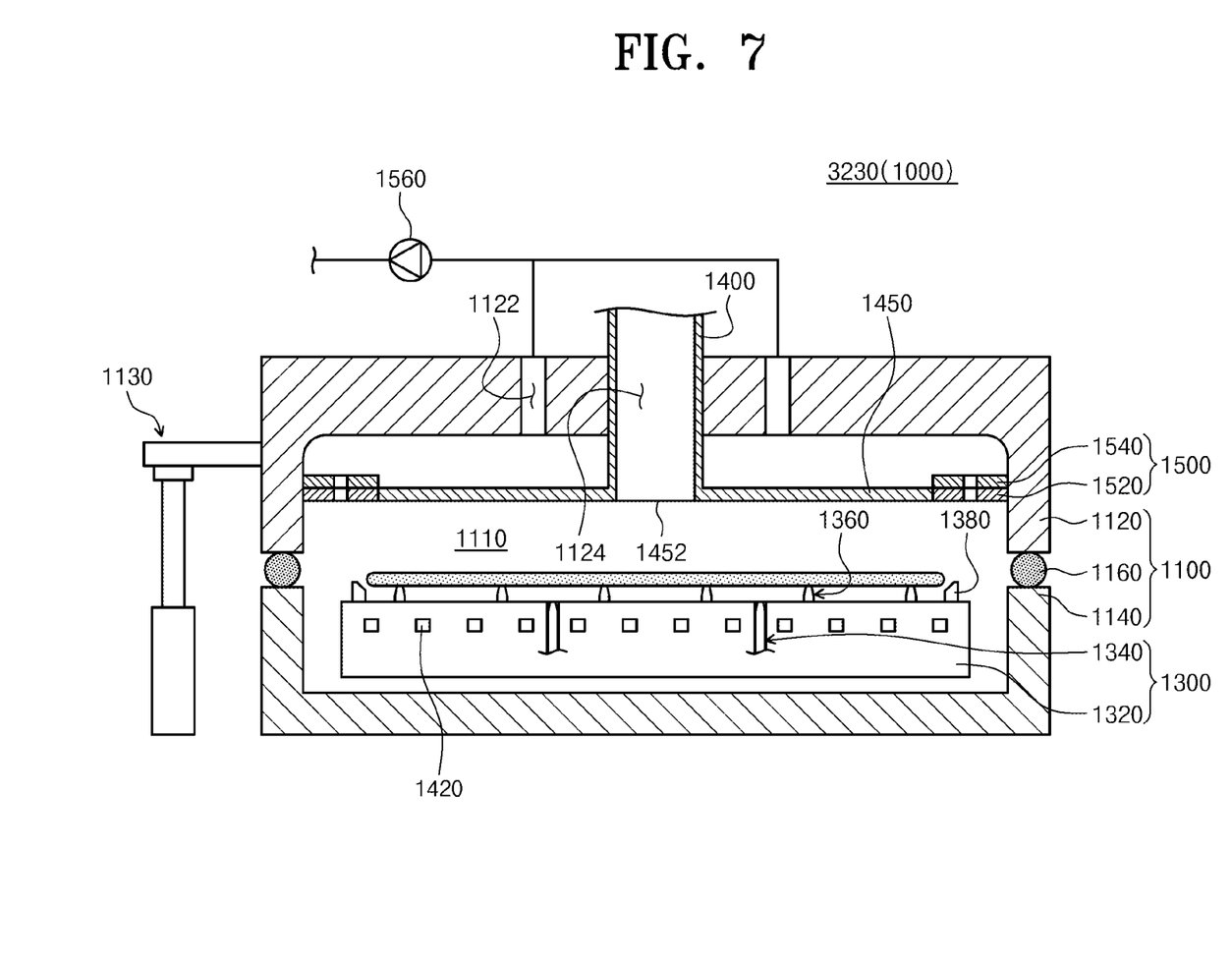
FIG. 7 is a cross-sectional view showing a heating unit of FIG. 5.

FIG. 5 is a plan view schematically showing an example of the heat treating chamber of FIG. 4. FIG. 6 is a front view of the heat treating chamber in FIG. 5. FIG. 7 is a cross-sectional view showing the heating unit in FIG. 5. Referring to FIG. 5 to FIG. 7, the heat treating chamber 3202 has a housing 3210, a cooling unit 3220, a heating unit 3230, and a transfer plate 3240.

The housing 3210 is generally formed in a shape of a cuboid. A substrate inlet (not shown) through which the substrate W enters and exits is formed in a sidewall of the housing 3210. The substrate inlet may be maintained in an open state. Alternatively, a door (not shown) may be configured to open and close the substrate inlet. The cooling unit 3220, the heating unit 3230, and transfer plate 3240 are received in the housing 3210. The cooling unit 3220 and the heating unit 3230 are arranged side by side along the second direction 14. In one example, the cooling unit 3220 may be located closer to the transfer chamber 3400 than the heating unit 3230 may be.

The cooling unit 3220 has a cooling plate 3222. The cooling plate 3222 may have a generally circular shape when viewed from above. The cooling plate 3222 has a cooling member 3224. In one example, the cooling member 3224 may be formed inside the cooling plate 3222, and may be embodied as a channel through which cooling fluid flows.

The heating unit 3230 is embodied as an apparatus 1000 for heating the substrate to a temperature higher than room temperature. The heating unit 3230 heat-treats the substrate W in a decompressed atmosphere at or below normal pressure. The heating unit 3230 includes a chamber 1100, a substrate support unit 1300, a heater unit 1420, a gas supply pipe 1400, a counterpart plate 1450, and an exhaust unit 1500.

The chamber 1100 provides a treatment space 1110 to heat-treat the substrate W therein. The treatment space 1110 is embodied as a space blocked from an outside. The chamber 1100 includes an upper body 1120, a lower body 1140, and a sealing member 1160.

The upper body 1120 is formed in a shape of a cylinder having an open bottom. A central hole 1124 and peripheral holes 1122 are formed in a top surface of the upper body 1120. The central hole 1124 is formed at a center of the upper body 1120. The central hole 1124 functions as a passage through which a gas supply pipe is inserted. The peripheral hole 1122 exhausts an atmosphere of the treatment space 1110. A plurality of peripheral holes 1122 may be spaced apart from each other and may be arranged to surround the central hole 1124. In one example, the number of peripheral holes 1122 may be four.

The lower body 1140 is formed in a shape of a cylinder having an open top. The lower body 1140 is located below the upper body 1120. The upper body 1120 and the lower body 1140 face each other in a vertical direction. The upper body 1120 and the lower body 1140 are combined with each other to form the treatment space 1110 therein. The upper body 1120 and the lower body 1140 are positioned such that central axes thereof coincide with each other and extend in the vertical direction. The lower body 1140 may have the same diameter as the upper body 1120. That is, a top of the lower body 1140 may spatially correspond to a bottom of the upper body 1120.

One of the upper body 1120 and the lower body 1140 is moved to an opening position and a blocking position by an ascending and descending member 1130. A position of the other thereof is fixed. In this embodiment, it is assumed that a position of the lower body 1140 is fixed and the upper body 1120 is movable. The opening position refers to a position where the upper body 1120 and the lower body 1140 are separated from each other such that the treatment space 1110 is opened. The blocking position refers to a position where the treatment space 1110 defined by the lower body 1140 and the upper body 1120 is sealed from the outside.

The sealing member 1160 is located between the upper body 1120 and the lower body 1140. The sealing member 1160 allows the treatment space to be sealed from the outside when the upper body 1120 and the lower body 1140 are in contact with each other. The sealing member 1160 may be formed in an annular ring shape. The sealing member 1160 may be fixedly coupled to a top of the lower body 1140.

The substrate support unit 1300 supports the substrate W in the treatment space 1110. The substrate support unit 1300 is fixedly coupled to the lower body 1140. The substrate support unit 1300 includes a support plate 1320, a lift pin 1340, and a support pin 1360. The support plate 1320 transfers heat generated from a heater unit 1400 to the substrate W. The support plate 1320 is formed in a circular plate shape. A top surface of the support plate 1320 has a larger diameter than that of the substrate W. The top surface of the support plate 1320 functions as a seat surface on which the substrate W is placed. On the seat surface, the lift pin 1340 and the support pin 1360 are formed. The lift pin 1340 raises and lowers the substrate W on the support plate 1320. A plurality of lift pins 1340 may be provided. Each lift pin is formed in a pin shape extending vertically. The lift pin 1340 may be moved downward so that a top thereof is located within the support plate 1320, or may be moved upward such that a top thereof is positioned above the seat surface.

The support pin 1360 prevents the substrate W from directly contacting the seat surface. The support pin 1360 is formed in a pin shape having a length direction parallel to the lift pin 1340. A plurality of support pins 1360 may be provided. Each support pin is fixedly mounted on the seat surface. The support pins 1360 protrude upwards from the seat surface. A top of the support pin 1360 is embodied as a contact surface directly contacting a bottom surface of the substrate W. The contact surface has a upwardly convex shape Accordingly, a contact area between the support pin 1360 and the substrate W may be minimized.

A guide 1380 guides the substrate W so that the substrate W is placed at a correct position on the seat surface. The guide 1380 is constructed to have an annular ring shape surrounding the seat surface. The guide 1380 has a larger diameter than that of the substrate W. An inner surface of the guide 1380 has an inwardly downwardly inclination toward a central axis of the support plate 1320. Accordingly, when an edge of the substrate W contacts the inner surface of the guide 1380, the substrate W is moved downwardly to the correct position along the inclined surface. In addition, the guide 1380 may suppress airflow flowing between the substrate W and the seat surface to a small amount.

The heater unit 1420 heat-treats the substrate W placed on the support plate 1320. The heater unit 1420 is located below the substrate W placed on the support plate 1320. The heater unit 1420 includes a plurality of heaters 1420. Each of the heaters 1420 is located in the support plate 1320. Alternatively, the heaters 1420 may be located on a bottom surface of the support plate 1320. The heaters 1420 are located on the same plane. In one example, the heaters 1420 may heat different regions of the seat surface to different temperatures. Some of the heaters 1420 may heat a central region of the seat surface to a first temperature, while the rest of the heaters 1420 may heat an edge region of the seat surface to a second temperature. The second temperature may be higher than the first temperature. The heaters 1420 may be embodied as a printed pattern or a heating wire.

The gas supply pipe 1400 supplies the process gas to the treatment space 1110. The gas supply pipe 1400 is installed in a ceiling surface of the chamber 1100. That is, the gas supply pipe 1400 is installed in the upper body 1120. The gas supply pipe 1400 is positioned so that a bottom thereof is located in the treatment space 1110. When viewed from above, the gas supply pipe 1400 may be positioned to coincide with the central axis of the upper body 1120. The gas supply pipe 1400 may be positioned to coincide with a central axis of the substrate W supported on the substrate support unit 1300.

The counterpart plate 1450 controls flow of the process gas supplied to the treatment space 1110. The counterpart plate 1450 controls the flow of the process gas so that the gas supplied from the gas supply pipe 1400 diffuses from the central region of the substrate W to the edge region containing a distal end and thus is uniformly distributed across an entirety of the surface of the substrate. The counterpart plate 1450 is formed in a plate shape having a hollow 1452. The gas supply pipe 1400 is positioned to be inserted into the hollow 1452 of the counterpart plate 1450. The gas supply pipe 1400 and the counterpart plate 1450 are fixedly coupled to each other. For example, the gas supply pipe 1400 and the counterpart plate 1450 may be formed integrally with each other. The counterpart plate 1450 is positioned to have a vertical level corresponding to that of the upper body 1120. The counterpart plate 1450 has a diameter smaller than an inner diameter of the upper body 1120. Accordingly, a gap is formed between an outer surface of the counterpart plate 1450 and the inner surface of the upper body 1120.

Figure 8:
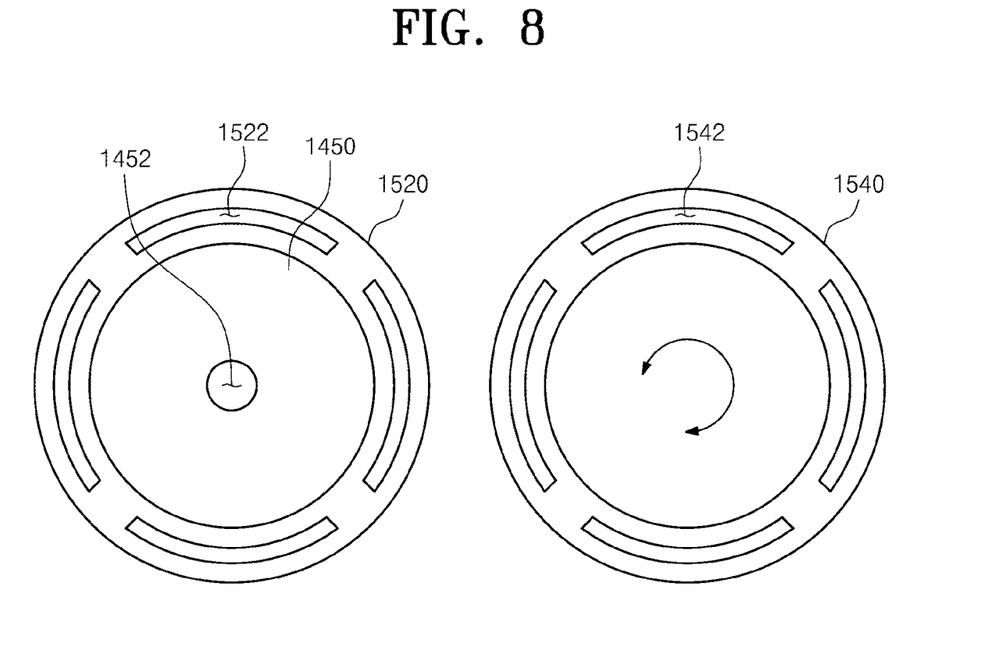
FIG. 8 is a plan view showing a counterpart plate, an exhaust plate, and an adjustment plate of FIG. 7.

The exhaust unit 1500 forcibly exhausts the treatment space 1110. The exhaust unit 1500 controls an exhausted amount of the process gas in the treatment space 1110 and adjusts a residual amount of the process gas in the treatment space 1110. The exhaust unit 1500 includes an exhaust plate 1520 and an adjustment plate 1540. FIG. 8 is a plan view showing the counterpart plate, the exhaust plate, and the adjustment plate in FIG. 7. Referring to FIG. 8, the exhaust plate 1520 is embodied as an annular ring shape surrounding the counterpart plate 1450. The exhaust plate 1520 is configured to extend from an outer peripheral surface of the counterpart plate 1450. The exhaust plate 1520 may be formed integrally with the counterpart plate 1450. The exhaust plate 1520 is located in the gap between the counterpart plate 1450 and the upper body 1120. A plurality of exhaust holes 1522 are formed in the exhaust plate 1520. When viewed from above, the exhaust holes 1522 are configured to be located outside the substrate W supported on the substrate support unit 1300. The exhaust holes 1522 are arranged along the circumferential direction of the exhaust plate 1520. Each of the exhaust holes 1522 may extend in an arc shape surrounding the central axis. Thus, the process gas present under the counterpart plate 1450 may pass through the exhaust holes 1522 to a position above the counterpart plate 1450. In this embodiment, the exhausted amount is defined as an amount of the process gas by which the process gas moves from a position below the counterpart plate 1450 to a position above the counterpart plate 1450.

The adjustment plate 1540 controls the exhausted amount of the process gas. The adjustment plate 1540 has an annular ring shape, and has a plurality of adjustment holes 1542 defined therein. The adjustment plate 1540 may be formed in an annular ring shape corresponding to a shape of the exhaust plate 1520. The adjustment hole 1542 may have the same shape as that of the exhaust hole 1522. The adjustment holes 1542 may be arranged along the circumferential direction. The adjustment plate 1540 is stacked on a top surface of the exhaust plate 1520. Some or all of the adjustment holes 1542 and the exhaust holes 1522 may overlap each other. When viewed from above, the exhausted amount varies depending on an overlapping amount between the adjustment hole 1542 and the exhaust hole 1522. That is, an opening area of the exhaust hole 1522 may be controlled by the adjustment hole 1542, thereby to adjust the exhausted amount. For example, when the adjustment hole 1542 and the exhaust hole 1522 entirely overlap with each other, a maximum exhausted amount may be achieved. Although the adjustment hole 1542 has the same shape as that of the exhaust hole 1522 in this embodiment, the adjustment hole 1542 may be configured to have a smaller size than that of the exhaust hole 1522. The overlapping amount between the adjustment hole 1542 and the exhaust hole 1522 may vary via rotation of the adjustment plate 1540. Preferably, the adjustment plate 1540 is located on top of the exhaust plate 1520. When the adjustment plate 1540 is located on top of the exhaust plate 1520, an asymmetric amount of a space below the counterpart plate 1450 may be minimized. In addition, contamination of the substrate W caused when particles generated while the adjustment plate 1540 is rotated drop onto the substrate may be minimized.

Figure 9:
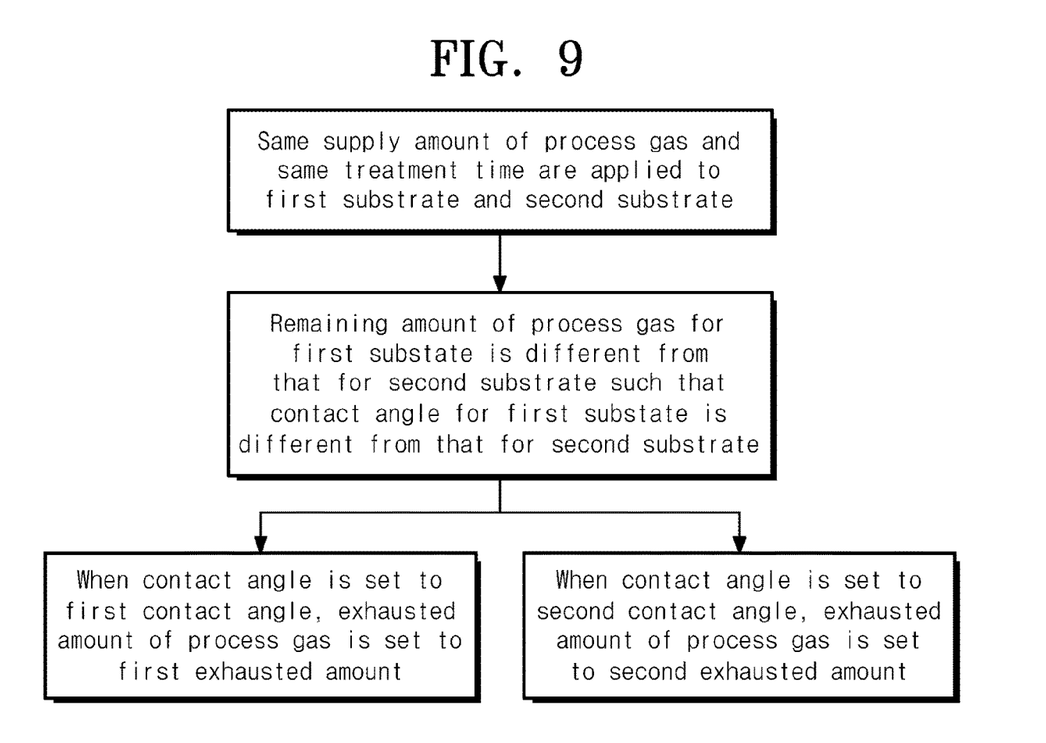
FIG. 9 is a flowchart showing a process of treating a substrate using a heating unit of FIG. 7.

Hereinafter, a process of supplying the process gas onto the substrate W to modify the surface of the substrate W will be described. In this connection, when the surface of the substrate W is modified, the surface of the substrate W may be modified from a hydrophilic state to a hydrophobic state. The surface modification of the substrate W may allow a surface property value of the substrate W to be adjusted. The surface property value of the substrate W may be a contact angle. The contact angle may decrease as the surface of the substrate W has higher hydrophobicity. The heating unit sequentially treats a plurality of substrates W. Thus, different surface property values of the substrates W are required based on treating processes of the substrate. Different surface property values of the substrates W may be applied depending on different types of photoresist applied to the substrate W. However, even when the types of the photoresist are different, the process of treating the substrate W may not vary. Thus, a recipe including a treatment time and a supply amount of the process gas may not vary.

In one example, a first contact angle may be required for a first substrate $W^1$ and a second contact angle may be required for a second substrate $W_2$. The first contact angle may be larger than the second contact angle. In this case, the same supply amount of the process gas is applied to the first substrate $W_1$ and the second substrate $W_2$, and the same treatment time is applied thereto. However, for the first substrate $W_1$, the process gas is exhausted by a first exhausted amount, and for the second substrate $W_2$, the process gas is exhausted by a second exhausted amount. The first exhausted amount is larger than the second exhausted amount. Accordingly, for the second substrate $W_2$, a residual amount of the process gas is larger than that for the first substrate $W_1$. Thus, the second substrate $W_2$ may have a surface more hydrophobic than that of the first substrate $W_1$.

In the above-described embodiment, the counterpart plate 1450 and the exhaust plate 1520 have been described as being integrally formed with each other. However, the exhaust plate 1520 may be removable from the counterpart plate 1450.

Referring back to FIG. 5 and FIG. 6, the transfer plate 3240 has a generally disc shape, and has a diameter corresponding to that of the substrate W. A notch 3244 is formed in an edge of the transfer plate 3240. The notch 3244 may have a shape corresponding to that of a protrusion 3429 formed on the hand 3420 of the transfer robot 3422 as described above. Further, the number of the notches 3244 may correspond to the number of the protrusions 3429 formed on the hand 3420, and a position of each notch may correspond to that of each protrusion 3429. When the hand 3420 and the transfer plate 3240 are aligned with each other in the vertical direction, vertical levels of the hand 3420 and the transfer plate 3240 may vary, such that the substrate W is transferred between the hand 3420 and the transfer plate 3240. The transfer plate 3240 may be mounted on a guide rail 3249, and may be moved between a first region 3212 and a second region 3214 along the guide rail 3249 by an actuator 3246. The transfer plate 3240 may have a plurality of slit-shaped guide grooves 3242. The guide groove 3242 extends from a distal end of the transfer plate 3240 to the interior of the transfer plate 3240. The guide groove 3242 has a length direction along the second direction 14. The guide grooves 3242 may be spaced apart from each other along the first direction 12. The guide groove 3242 prevents the transfer plate 3240 and the lift pin 1340 from interfering with each other when the substrate W is transferred between the transfer plate 3240 and the heating unit 3230.

Heating of the substrate W is carried out in a state in which the substrate W is directly placed on the support plate 1320. The substrate W is cooled in a state where the transfer plate 3240 on which the substrate W is placed is in contact with the cooling plate 3222. To ensure good heat transfer between the cooling plate 3222 and the substrate W, the transfer plate 3240 is made of a material with a high thermal conductivity. In one example, the transfer plate 3240 may be made of a metal material.

A plurality of liquid treating chambers 3600 may be provided. Some of the liquid treating chambers 3600 may be stacked vertically. The liquid treating chambers 3600 are arranged on one side of the transfer chamber 3400. The liquid treating chambers 3600 are arranged side by side along the first direction 12. Some of the liquid treating chambers 3600 are disposed adjacent to the index module 20. Hereinafter, the liquid treating chamber adjacent to the index module 20 is referred to as a front liquid treating chamber 3602. The rest of the liquid treating chambers 3600 are adjacent to the interface module 40. Hereinafter, the liquid treating chamber adjacent to the interface module 40 is referred to as a rear liquid treating chamber 3604.

The front liquid treating chamber 3602 applies first liquid on the substrate W. The rear liquid treating chamber 3604 applies second liquid on the substrate W. The first liquid and the second liquid may be different types of liquids. According to one embodiment, the first liquid forms an anti-reflection film, and the second liquid forms a photoresist film. The photoresist may be applied on the substrate W having the anti-reflection film coated thereon. Alternatively, the first liquid may form a photoresist film, and the second liquid may form an anti-reflective film. In this case, the anti-reflective film may be applied on the substrate W having the photoresist film formed thereon. Alternatively, the first liquid and the second liquid may be of the same type as the photoresist.

Figure 10:
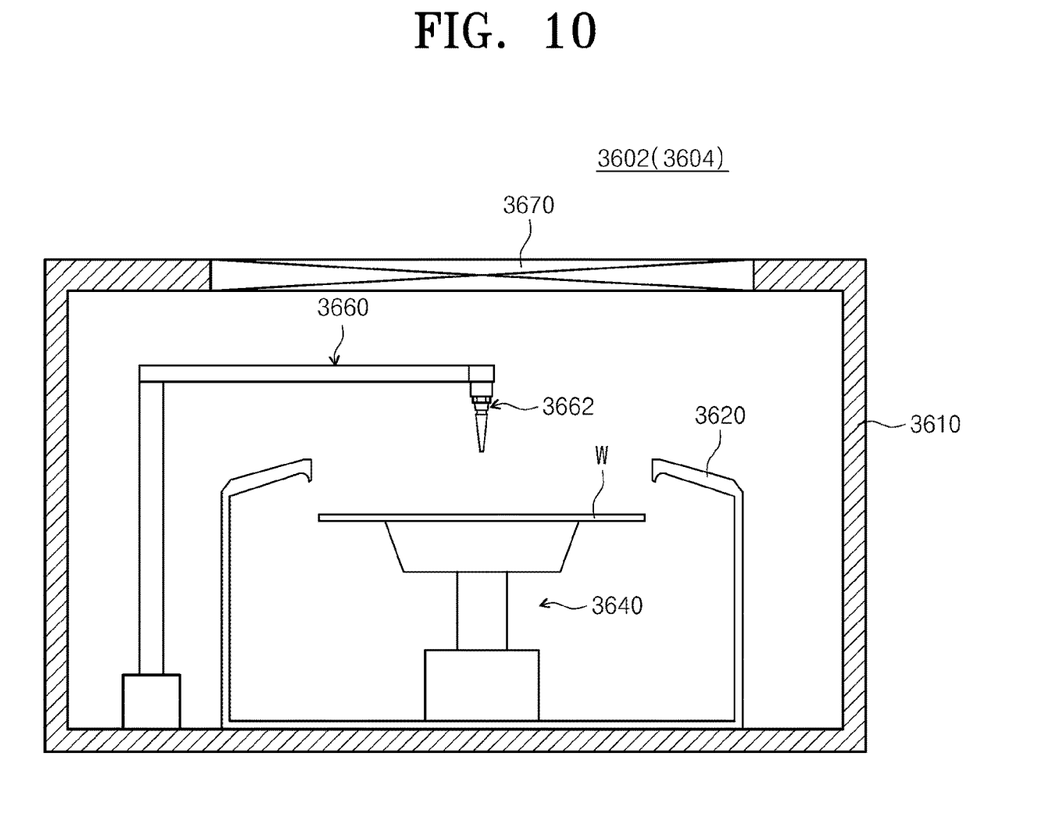
FIG. 10 is a view schematically showing an example of a liquid treating chamber of FIG. 6.

FIG. 10 schematically shows an example of the liquid treating chamber in FIG. 6. Referring to FIG. 10, the liquid treating chamber 3600 has a housing 3610, a treating container 3620, a substrate support unit 3640, and a liquid supply unit 3660. The housing 3610 is generally formed in a shape of a cuboid. A substrate inlet through which the substrate W enters and exits is formed in a sidewall of the housing 3610. The substrate inlet may be opened and closed by a door (not shown). The treating container 3620, the substrate support unit 3640, and the liquid supply unit 3660 are received in the housing 3610. A fan filter unit 3670 for generating a descending air flow in the housing 3610 may be disposed in an upper wall of the housing 3610. The treating container 3620 is formed in a shape of a cup having an open top. The treating container 3620 has a treatment space defined therein for treating the substrate therein. The substrate support unit 3640 is placed in the treatment space and supports the substrate W. The substrate support unit 3640 is configured to allow the substrate W to rotate during the liquid treating process. The liquid supply unit 3660 supplies the liquid to the substrate W supported on the substrate support unit 3640.

The liquid supply unit 3660 includes a treating liquid nozzle 3662. The treating liquid nozzle 3662 discharges the treating liquid to the substrate W supported on the substrate support unit 3640. For example, the treating liquid may be photo-sensitive liquid such as the photoresist. The treating liquid nozzle 3662 is moved between a process position and a standby position. In this connection, the process position refers to a position where the treating liquid nozzle 3662 downwardly faces the substrate W supported on the substrate support unit 3640. The standby position refers to a position where the treating liquid nozzle 3662 is outside the process position. The process position may refer to a position where the treating liquid nozzle 3662 may discharge the treating liquid to a center of the substrate W.

Referring back to FIG. 2 and FIG. 3, a plurality of buffer chambers 3800 may be provided. Some of the buffer chambers 3800 are disposed between the index module 20 and the transfer chamber 3400. Hereinafter, the buffer chamber disposed between the index module 20 and the transfer chamber 3400 is referred to as a front buffer 3802. A plurality of front buffers 3802 may be provided and may be stacked vertically. The rest of the buffer chambers 3802 and 3804 are placed between the transfer chamber 3400 and the interface module 40. Hereinafter, the buffer chamber placed between the transfer chamber 3400 and the interface module 40 is referred to as a rear buffer 3804. A plurality of rear buffers 3804 may be provided and may be stacked vertically. Each of the front buffers 3802 and the rear buffers 3804 temporarily stores a plurality of the substrates W therein. The substrate W stored in the front buffer 3802 is carried in or out by the index robot 2200 and the transfer robot 3422. The substrate W stored in the rear buffer 3804 is carried in or out by the transfer robot 3422 and a first robot 4602.

A front transfer robot is located on one side of the front buffer 3802. The front transfer robot transfers the substrate between the front buffer 3802 and the front heat treating chamber.

The developing block 30b has the heat treating chamber 3200, the transfer chamber 3400, and the liquid treating chamber 3600. The heat treating chambers 3200 and the transfer chambers 3400 of the developing block 30b may have a structure and an arrangement substantially similar to those of the heat treating chambers 3200 and the transfer chambers 3400 of the application block 30a. Thus, a description thereof will be omitted.

In the developing block 30*b*, all of the liquid treating chambers 3600 are embodied as developing chambers 3600 which may supply developing liquid onto the substrate W to develop the substrate W using the developing liquid.

The interface module 40 connects the treating module 30 to an external exposure apparatus 50. The interface module 40 has an interface frame 4100, an additional process chamber 4200, an interface buffer 4400, and a transfer member 4600.

A fan filter unit for generating a descending air in the interface frame 4100 is disposed in a top of the interface frame 4100. The additional process chamber 4200, the interface buffer 4400, and the transfer member 4600 are disposed inside the interface frame 4100. The additional process chamber 4200 may perform a predetermined additional process before the substrate W for which the application process has been completed in the application block 30*a* is brought into the exposure apparatus 50. Alternatively, the additional process chamber 4200 may perform a predetermined additional process before the substrate W for which an exposure process has been completed in the exposure apparatus 50 is carried into the developing block 30*b*. In one example, the additional process may include an edge exposure process for exposing an edge region of the substrate W, or a top surface cleaning process for cleaning a top surface of the substrate W, or a bottom surface cleaning process for cleaning a bottom surface of the substrate W. A plurality of additional process chambers 4200 may be provided and may be stacked vertically. All of the additional process chambers 4200 may be configured to perform the same process. Alternatively, some of the additional process chambers 4200 may be configured to perform different processes.

The interface buffer 4400 provides a stay space where the substrate W temporarily stays during the transfer process between the application block 30*a*, the additional process chamber 4200, the exposure apparatus 50, and the developing block 30*b*. A plurality of interface buffers 4400 may be provided. The plurality of interface buffers 4400 may be configured to be stacked vertically.

In one example, the additional process chamber 4200 may be disposed on one end of the transfer chamber 3400 in an extension line of a length direction thereof, while the interface buffer 4400 may be disposed on the other end thereof in an extension line of a length direction of the transfer chamber 3400.

The transfer member 4600 transfers the substrate W between the application block 30*a*, the additional process chamber 4200, the exposure apparatus 50, and the developing block 30*b*. The transfer member 4600 may be embodied as one robot or a plurality of robots. In one example, the transfer member 4600 has the first robot 4602 and a second robot 4606. The first robot 4602 may transfer the substrate W between the application block 30*a*, the additional process chamber 4200, and the interface buffer 4400. The interface robot 4606 may transfer the substrate W between the interface buffer 4400 and the exposure apparatus 50. The second robot 4604 may transfer the substrate W between the interface buffer 4400 and the developing block 30*b*.

Each of the first robot 4602 and the second robot 4606 may include a hand on which the substrate W is placed. The hand may be configured to be able to move forward and backward, rotate about an axis parallel to the third direction 16, and move along the third direction 16.

The hand of each of the index robot 2200, the first robot 4602, and the second robot 4606 may have the same shape as that of the hand 3420 of the transfer robot 3422. Alternatively, the hand of the robot for delivering and receiving the substrate W directly with respect to the transfer plate 3240 of the heat treating chamber may have the same shape as that of the hand 3420 of the transfer robot 3422, and the hand of each of the remaining robots may have a different shape from that of the hand 3420 of the transfer robot 3422.

According to one embodiment, the index robot 2200 may be configured for directly delivering and receiving the substrate W with respect to the heating unit 3230 of the front heat treating chamber 3200 disposed in the application block 30*a*.

Further, the transfer robot 3422 disposed in each of the application block 30*a* and the developing block 30*b* may be configured to directly deliver and receive the substrate W with respect to the transfer plate 3240 located in the heat treating chamber 3200.

Next, one embodiment of a method of treating the substrate using the substrate treating apparatus 1 as described above and will be described.

An application process, an edge exposure process, an exposure process, and a developing process are sequentially performed on the substrate W.

In the application process, a heat treating process in the heat treating chamber 3200, an anti-reflective film application process in the front liquid treating chamber 3602, a heat treating process in the heat treating chamber 3200, a photoresist film application process in the rear liquid treating chamber 3604, and a heat treating process in the heat treating chamber 3200 are sequentially performed.

Hereinafter, an example of a transfer path of the substrate W from the container 10 to the exposure apparatus 50 will be described.

The index robot 2200 takes the substrate W out of the container 10 and transfers the substrate W to the front buffer 3802. The transfer robot 3422 transfers the substrate W stored in the front buffer 3802 to the front heat treating chamber 3200. The substrate W is transferred to the heating unit 3230 via the transfer plate 3240. When the heating process of the substrate in the heating unit 3230 is completed, the transfer plate 3240 transfers the substrate to the cooling unit 3220. While the transfer plate 3240 supports the substrate W thereon, the transfer plate 3240 contacts the cooling unit 3220 to perform the cooling process of the substrate W. When the cooling process is completed, the transfer plate 3240 is moved to a position above the cooling unit 3220. The transfer robot 3422 takes the substrate W out of the heat treating chamber 3200 and transfers the substrate to the front liquid treating chamber 3602.

In the front liquid treating chamber 3602, an antireflection film is applied on the substrate W.

The transfer robot 3422 takes the substrate W out of the front liquid treating chamber 3602 and imports the substrate W into the heat treating chamber 3200. In the heat treating chamber 3200, the heating process and the cooling process as described above are sequentially performed. When the heating and cooling processes are completed, the transfer robot 3422 takes out the substrate W and transfers the substrate to the rear liquid treating chamber 3604.

Subsequently, a photoresist film is applied on the substrate W in the rear liquid treating chamber 3604.

The transfer robot 3422 takes out the substrate W out of the rear liquid treating chamber 3604 and imports the substrate W into the heat treating chamber 3200. In the heat treating chamber 3200, the heating process and the cooling process as described above are sequentially performed. When the heating and cooling processes are completed, the transfer robot 3422 transfers the substrate W to the rear buffer 3804. The first robot 4602 of the interface module 40 exports the substrate W out of the rear buffer 3804 and transfers the substrate to the additional process chamber 4200.

The edge exposure process is performed on the substrate W in the additional process chamber 4200.

Subsequently, the first robot 4602 exports the substrate W out of the additional process chamber 4200 and transfers the substrate W to the interface buffer 4400.

Subsequently, the second robot 4606 exports the substrate W out of the interface buffer 4400 and transfers the substrate W to the exposure apparatus 50.

The developing process may be performed by sequentially performing a heat treating process S81 in the heat treating chamber 3200, a developing process in the liquid treating chamber 3600, and a heat treating process in the heat treating chamber 3200.

Hereinafter, an example of a transfer path of the substrate W from the exposure apparatus 50 to the container 10 will be described.

The second robot 4606 takes out the substrate W from the exposure apparatus 50 and transfers the substrate W to the interface buffer 4400.

Subsequently, the first robot 4602 exports the substrate W out of the interface buffer 4400 and transfers the substrate W to the rear buffer 3804. The transfer robot 3422 takes out the substrate W from the rear buffer 3804 and transfers the substrate W to the heat treating chamber 3200. In the heat treating chamber 3200, the heating process and the cooling process of the substrate W are sequentially performed. When the cooling process is completed, the transfer robot 3422 transfers the substrate W to the developing chamber 3600.

In the developing chamber 3600, the developing liquid is supplied on the substrate W to perform the developing process.

The substrate W is taken out of the developing chamber 3600 by the transfer robot 3422 and brought into the heat treating chamber 3200 by the transfer robot 3422. The heating process and the cooling process of the substrate W are sequentially performed in the heat treating chamber 3200. When the cooling process is completed, the substrate W is taken out of the heat treating chamber 3200 by the transfer robot 3422 and transferred to the front buffer 3802 by the transfer robot 3422.

Subsequently, the index robot 2200 takes out the substrate W from the front buffer 3802 and transfers the substrate to the container 10.

An example in which the treating block of the substrate treating apparatus 1 as described above performs the application process and the developing process has been described above. However, alternatively, the substrate treating apparatus 1 may include only the index module 20 and the treating module 30 without the interface module. In this case, the treating module 30 performs only the application process. A film applied on the substrate W may be a spin on hard mask (SOH) film.

According to an embodiment of the inventive concept, an opened area of the exhaust hole is controlled. Thus, the exhausted amount and the residual amount of the process gas supplied to the treatment space for the substrate may be controlled.

In addition, according to the embodiment of the inventive concept, the amount of the process gas remaining in the treatment space may be controlled, such that the surface property value of the substrate may be adjusted without changing the gas supply amount and the treatment time.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

REFERENCE NUMERALS

| | |
|---|---|
| 1400: Gas supply pipe | 1450: Counterpart plate |
| 1500: Exhaust unit | 1520: Exhaust plate |
| 1522: Exhaust hole | 1540: Adjustment plate |
| 1542: Adjustment hole | |

What is claimed is:

1. An apparatus for treating a substrate using a process gas, the apparatus comprising:
   a chamber having a treatment space defined therein;
   a substrate support unit for supporting the substrate in the treatment space;
   a gas supply pipe disposed in a ceiling surface of the chamber for supplying the process gas to the treatment space; and
   an exhaust unit for exhausting the process gas in the treatment space,
   wherein the exhaust unit includes:
      an exhaust plate having an exhaust hole defined therein through which the process gas is exhausted; and
      an adjustment plate overlapping the exhaust plate, wherein the adjustment plate is constructed to control an opened amount of the exhaust hole when viewed from above,
      wherein the exhaust plate and adjustment plate are disposed between the ceiling surface of the chamber and the substrate placed on the substrate support unit.

2. The apparatus of claim 1, wherein when viewed from above, the exhaust hole does not overlap the substrate placed on the substrate support unit.

3. The apparatus of claim 2, wherein the apparatus further comprises a counterpart plate facing away the substrate placed on the substrate support unit,
   wherein the supply pipe is connected to a center of the counterpart plate, and
   wherein the exhaust plate is constructed to surround the counterpart plate.

4. The apparatus of claim 3, wherein the counterpart plate and the exhaust plate are integrally formed with each other.

5. The apparatus of claim 2, wherein the adjustment plate is stacked on the exhaust plate, wherein the adjustment plate has an adjustment hole corresponding to the exhaust hole.

6. The apparatus of claim 5, wherein the adjustment plate is located above the exhaust plate.

7. The apparatus of claim 6, wherein the supply pipe is installed in a center of the ceiling surface, wherein the exhaust hole includes a plurality of exhaust holes,
   wherein the adjustment plate is constructed to vary an overlapping amount between the adjustment hole and the exhaust hole when viewed from above.

8. The apparatus of claim 7, wherein the plurality of exhaust holes are spaced apart from each other,
   wherein the adjustment hole includes a plurality of adjustment holes spaced apart from each other,
   wherein the plurality of exhaust holes are arranged such that a series thereof forms a ring shape, wherein the plurality of adjustment holes are arranged such that a series thereof forms a ring shape.

9. The apparatus of claim 8, wherein each of the exhaust hole and the adjustment hole extends in an arc shape.

10. The apparatus of claim 7, wherein the adjustment plate rotates about a central axis thereof to vary the overlapping amount between the adjustment hole and the exhaust hole.

11. The apparatus of claim 2, wherein the counterpart plate is between the ceiling surface of the chamber and the substrate placed on the substrate support unit, and wherein the exhaust plate is contacting and extending from an outer peripheral surface of the counterpart plate and contacting an inner surface of the chamber within the treatment space.

* * * * *